United States Patent [19]
Raghavan et al.

[11] Patent Number: 5,319,649
[45] Date of Patent: Jun. 7, 1994

[54] TRANSMISSION SYSTEMS AND DECODERS THEREFOR

[75] Inventors: Sreenivasa A. Raghavan; Yoav Hebron, both of San Diego, Calif.

[73] Assignee: Comstream Corporation, San Diego, Calif.

[21] Appl. No.: 814,889

[22] Filed: Dec. 27, 1991

[51] Int. Cl.$^5$ ............ G06F 11/10; H03M 13/00; H03M 13/12

[52] U.S. Cl. .................. 371/37.1; 371/49.2; 371/43

[58] Field of Search .......... 371/37.1, 37.8, 49.2, 371/43

[56] References Cited

U.S. PATENT DOCUMENTS

| | | | |
|---|---|---|---|
| 4,493,082 | 1/1985 | Cumberton et al. | 371/43 |
| 4,882,733 | 11/1989 | Tanner | 371/37.1 |
| 5,010,554 | 4/1991 | Bechtel et al. | 371/37.1 |
| 5,014,276 | 5/1991 | Bush et al. | 371/37.4 |
| 5,185,747 | 2/1993 | Farahati | 371/43 |

*Primary Examiner*—Robert W. Beausoliel, Jr.
*Assistant Examiner*—Trinh Tu
*Attorney, Agent, or Firm*—Stangler, Stempler & Dreyfus

[57] ABSTRACT

Digital data is processed by quantizing the data to produce samples, each with a most significant bits and least significant bits with the least significant bits representing reliabilities, generating a parities from the most significant bits of the samples, generating weight functions corresponding to the parities on the basis of the number of times a reliability measure occurs, and producing a corrected stream of data with the weight functions and the corresponding parities.

26 Claims, 12 Drawing Sheets

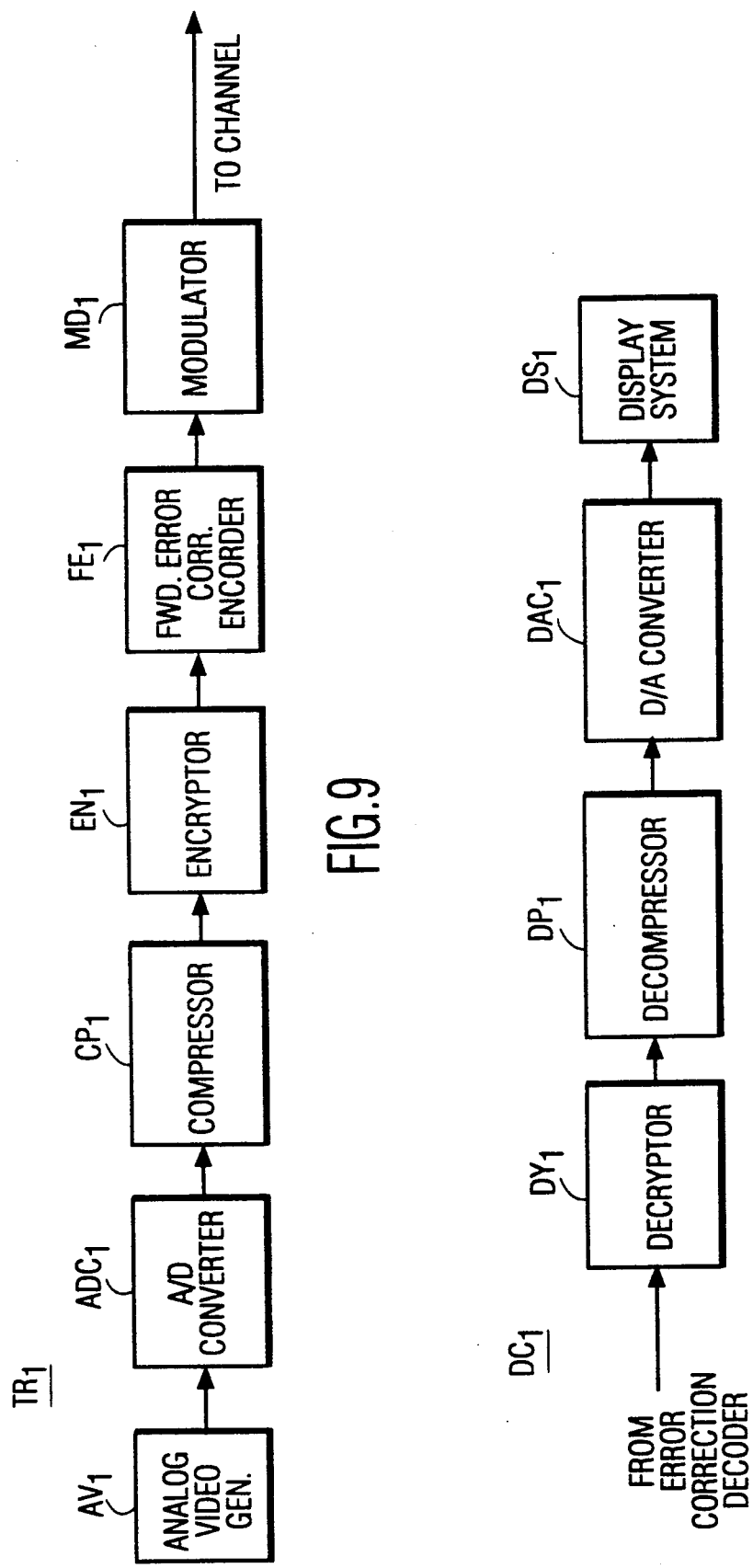

TRANSMISSION SYSTEMS AND DECODERS THEREFOR

BACKGROUND OF THE INVENTION

This invention relates to communication and other data transfer systems and to decoders therefor, and particularly to systems and decoders using soft decisions for decoding convolutional and block codes.

Communication and other data transfer systems employ error correction decoders to enhance the accuracy of the received information. In such systems the use of soft decision decoding of convolutional and block codes improves the error correction capability of a particular code. One technique of soft decision decoding is the optimum symbol-by-symbol decoding method disclosed in the article of C. R. P. Hartman, and L. D. Rudolph, entitled "An Optimum Symbol-by-Symbol Decoding Rule for Linear Codes," in the IEEE Transactions on Information Theory, IT-22, 514-517, September 1976. Another technique is a priori probabilistic (APP) decoding disclosed in the book "Threshold Decoding", by J. L. Massey, MIT Press 1963, Cambridge, Massachusetts.

The optimum symbol-by-symbol decoding technique uses soft decisions for decoding any block code whereas the APP decoding approach is suitable for threshold decodable codes, which may be block codes or convolutional codes. Threshold decodable codes are very helpful because of the simplicity of their implementations. However, the exact weight function needed to benefit from soft decisions in either the optimum symbol-by-symbol decoding operation or the exact APP decoding method is highly non-linear and very complex to implement when the block length or the constraint length is large. Hence it is practical to apply a simple approximation of the weight function that can give a good coding gain.

Previously known simple approximations of the weight function for soft decision decoding appear in the article of H. Tanaka, K. Furusawa, and S. Kaneku entitled "A Novel Approach to Soft Decision Decoding of Threshold Decodable Codes", IT-26, 244-246, March 1980. However, these fail to obtain the possible coding gain when the block code is long, i.e. has large block length, or if the constraint length of the convolutional code is long.

OBJECTS AND SUMMARY OF THE INVENTION

An object of this invention is to improve communication systems and error correction decoders.

Another object is to furnish such systems and error correction decoders with a simple, easily implemented weight function.

According to a feature of the invention, such objects are attained by generating a number of parity checks from the most significant bits of quantized data samples of signals that have passed through a transmission channel of a communication system, and generating weight functions corresponding to the parity checks on the basis of the number of times a reliability measure occurs. This results in an improved soft decision decoder.

Another aspect of the invention involves decoding the output of a soft decision decoder that uses weight functions based on the number of times a reliability measure occurs.

These and other features of the invention are pointed out in the claims. Other objects and advantages of the invention will become evident from the following detailed description when read in light of the accompanying drawings.

BRIEF DESCRIPTION OF THE DRAWINGS

FIG. a block diagram of a system embodying features of the invention.

FIG. 9 is a block diagram illustrating details of a transmitter shown in FIG. 1.

FIG. 10 is a block diagram showing an output circuit forming part of a receiver in FIG. 1.

DETAILED DESCRIPTION OF PREFERRED EMBODIMENTS

Figure 1:
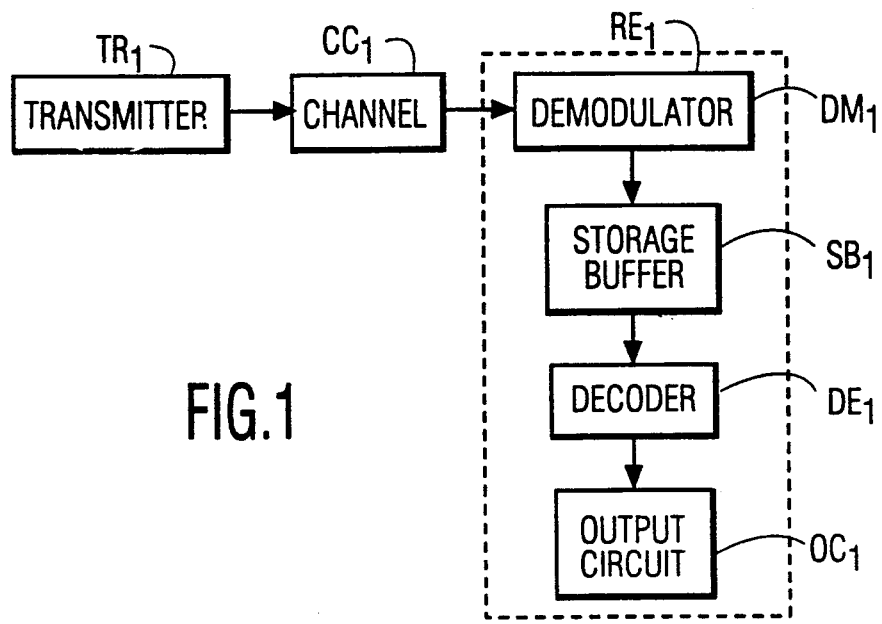

In the communication system of FIG. 1, a transmitter $TR_1$ transmits digital data through a communication channel $CC_1$ to a receiver $RE_1$. The receiver $RE_1$ includes a demodulator $DM_1$, a storage buffer $SB_1$, a decoder $DE_1$, and an output circuit $OC_1$.

In FIG. 1, the demodulator $DE_1$ extracts samples from the data and quantizes each extracted sample to Q bits, for example 3 bits. The most significant bits (MSB) in a sample from the demodulator $DE_1$ represent the hard decision and the least significant bits (LSB) represent the magnitude, or the reliability, of the sample. In a general case of Q bits, the first bit is used as the most significant bit and the last $Q-1$ bits the reliabilities. The storage buffer $SB_1$ stores the MSB's and LSB's of successive blocks of samples for application by block to the decoder $DE_1$.

Figure 2:
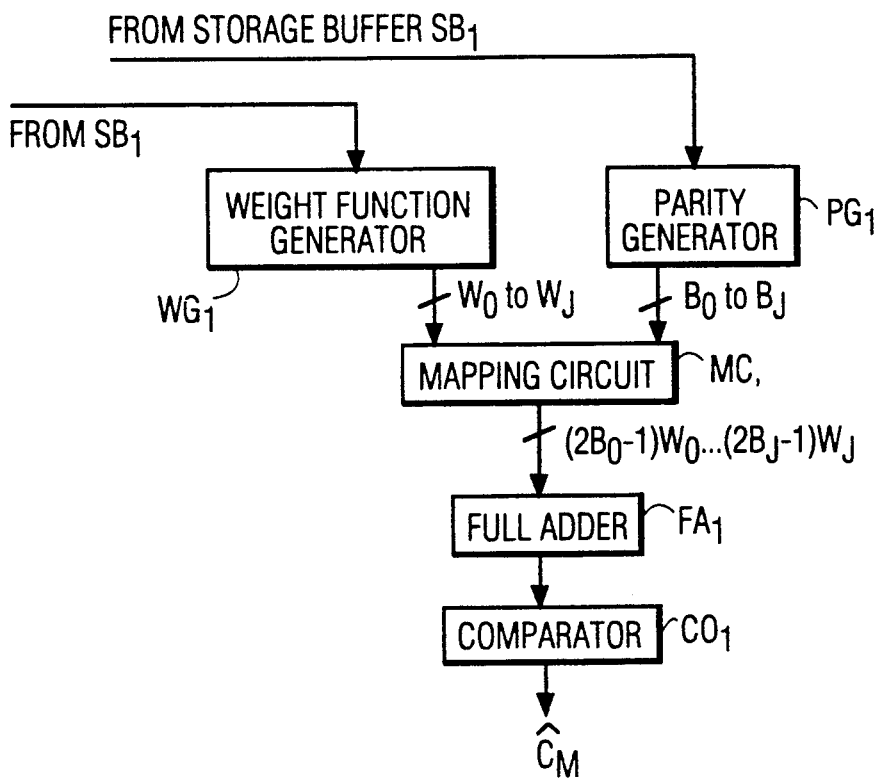
FIG. 2 is a block diagram of a decoder in FIG. 1 and also embodying features of the invention

Components of the decoder $DE_1$, appear in FIG. 2. Here a parity generator $PG_1$ receives the MSB's of samples in a block of data and generates $J+1$ parities $B_o$ to $B_J$. A weight function generator $WG_1$ receives the LSB's of the samples in a block of data and generates $J+1$ weight functions $W_o$ to $W_J$. A mapping circuit $MC_1$, weights and maps the parities $B_o$ to $B_J$ with the weight functions $W_o$ to $W_J$ to produce weighted parities $(2B_0-1)W_0$ to $(2B_J-1)W_J$ which enter the inputs of a full adder $FA_1$. The latter forms a decision variable F. A comparator $CO_1$ compares the value F with 0 to produce a value $C_m$ to establish a value 1 or 0. The value 1 or 0 passes to the output circuit $OC_1$ either directly or through a second buffer.

The generators $PG_1$ and $WG_1$ repeat the process with the mapping circuit $MC_1$, the full adder $FA_1$, and the comparator $CO_1$, for all the samples. The resulting bits also pass to the output circuit $OC_1$ either directly or through the second buffer. When the bits representing all the samples have been shifted, the buffer $SB_1$ applies the MSB's and LSB's of samples in a new block to the respective generators $PG_1$ and $WG_1$.

Figure 3:
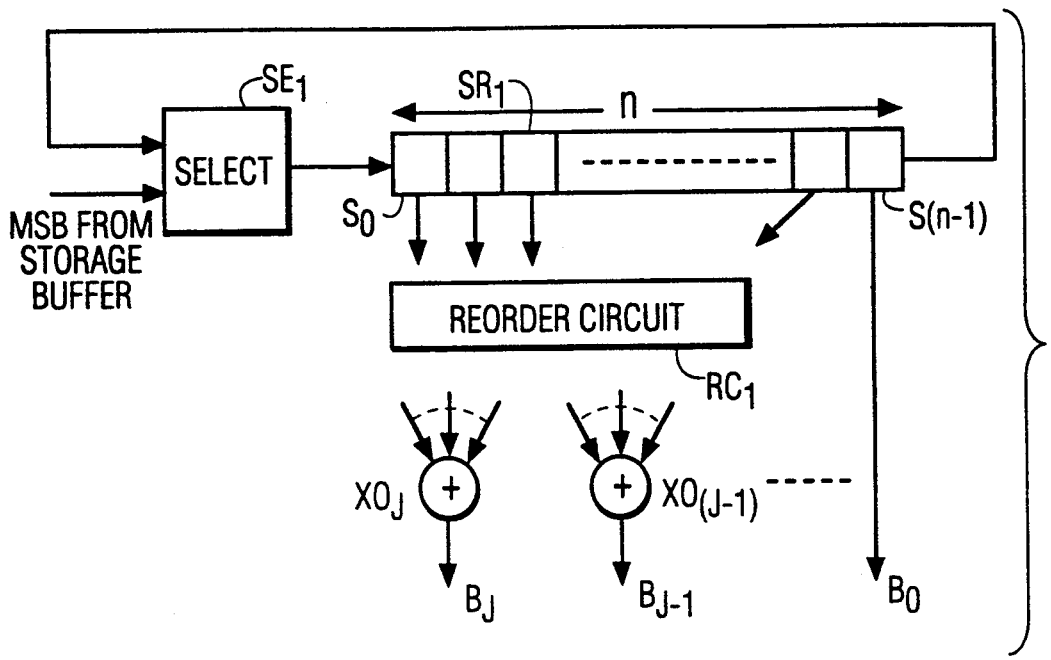
FIG. 3 is a block diagram of a parity generator in FIG. 2.

Details of the parity generator $PG_1$ appear in FIG. 3. Here, to generate J parities, a select switch $SE_1$ composed of two or more gates (not shown) selects n MSB's of a block of n samples stored in the buffer $SB_1$ and feeds them into an n stage shift register $SR_1$ with stages $S_0$ to $S_{(n-1)}$. Thereafter, the select switch $SE_1$ selects, i.e. connects to, a feedback path. In the first decoding cycle, after feeding of the MSB's in samples to the shift register $SR_1$, a reordering circuit $OC_1$ connects the stages $S_0$ to $S_{(n-2)}$ to J sets of multiple input exclusive OR circuits $XO_1$ to $XO_J$. The latter forms J parities $B_1$ to $B_J$. The stage $S_{(n-1)}$ forms parity $B_0$. Hence the system produces $(J+1)$ parities $B_0$ to $B_J$ from the n MSB's.

Reordering circuits of $S_j$, where j=1 to n, are known and have connections based on known codes. Further details of circuits such as $SE_1$, $SR_1$, $RC_1$, $XO_1$ to $XO_J$ appear in more detail in FIG. 13. The operation of such circuits is described in the book "Error Control Coding; Fundamentals and Applications", by Lin and Costello, page 208. The description is rendered in terms applicable to block code. This is only illustrative and the invention is usable with other codes, such as threshold decodable convolution codes.

Figure 4:
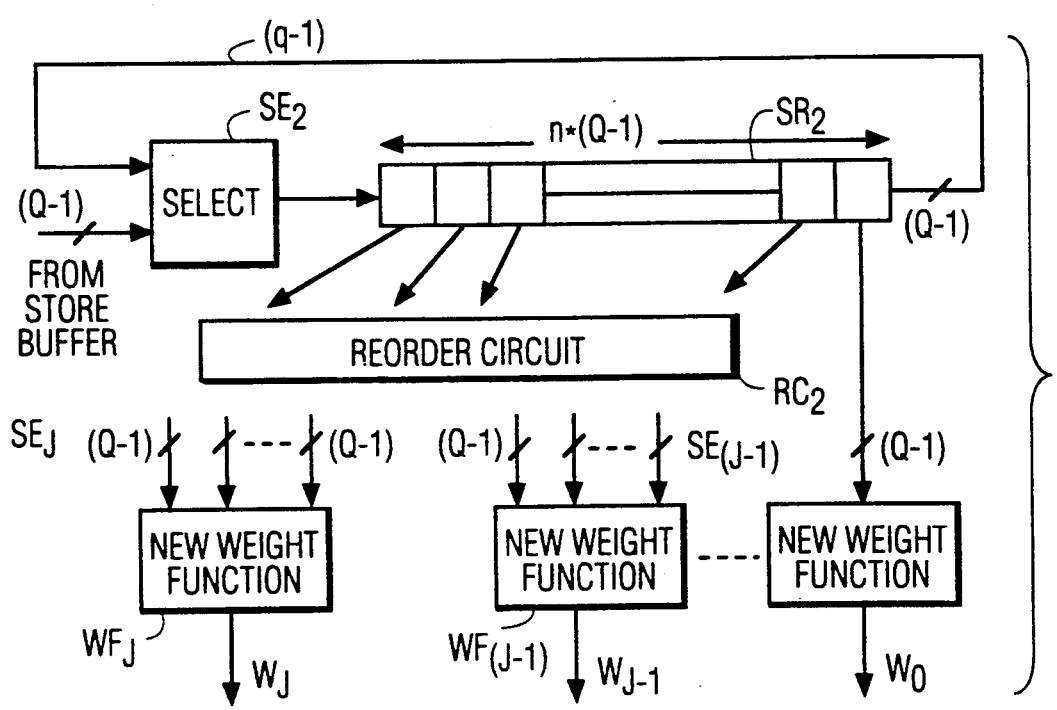
FIG. 4 is a block diagram of a weight function generator in FIG. 2.

FIG. 4 illustrates the weight function generator $WG_1$. Here, at the same time that the selector switch $SE_1$ supplies the n MSB's to the shift register $SR_1$ from the demodulator $DE_1$, a selector switch $SE_2$ furnishes the corresponding Q-1 LSB's from each of the n samples to a shift register $SR_2$ whose length is $(Q-1)*n$ bits. Thus the shift register $SR_2$ receive $n*(Q-1)$ LSB's from the block of samples.

A reorder circuit $RC_2$ reorders the first $(Q-1) * (n-1)$ outputs at the stages $S_0$ to $S_{[(n-1)(Q-1)-1]}$ of the shift register $SR_2$ into J sets $SE_1$ to $SE_J$ of $m*(Q-1)$ outputs each. The number m is a parameter of the known code (see Lin and Costello supra) and is the number of components in the parity equation for which the weight function is being determined. Each of the sets is divided into Q-1 groups of m binary elements. The m signals (Q-1) groups of J sets enter the inputs of J weight function circuits $WF_1$ to $WF_J$. The latter produce J weight functions $W_1$ to $W_J$ each corresponding to the analogous one of the J parities $B_1$ to $B_J$.

The last Q-1 stages, stages $S_{[(n-2)(Q-1)]}$ to $S_{(n-1)(Q-1)-1]}$, of the shift register supply a weight function circuit $WF_0$. The latter produces a weight $W_0$ corresponding to the parity $B_0$.

Figure 7A:
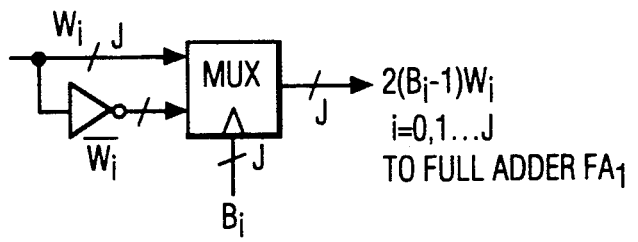
FIGS. 7A to 7C are block and circuit diagrams showing details of portions of FIG. 2.
Figure 7B:
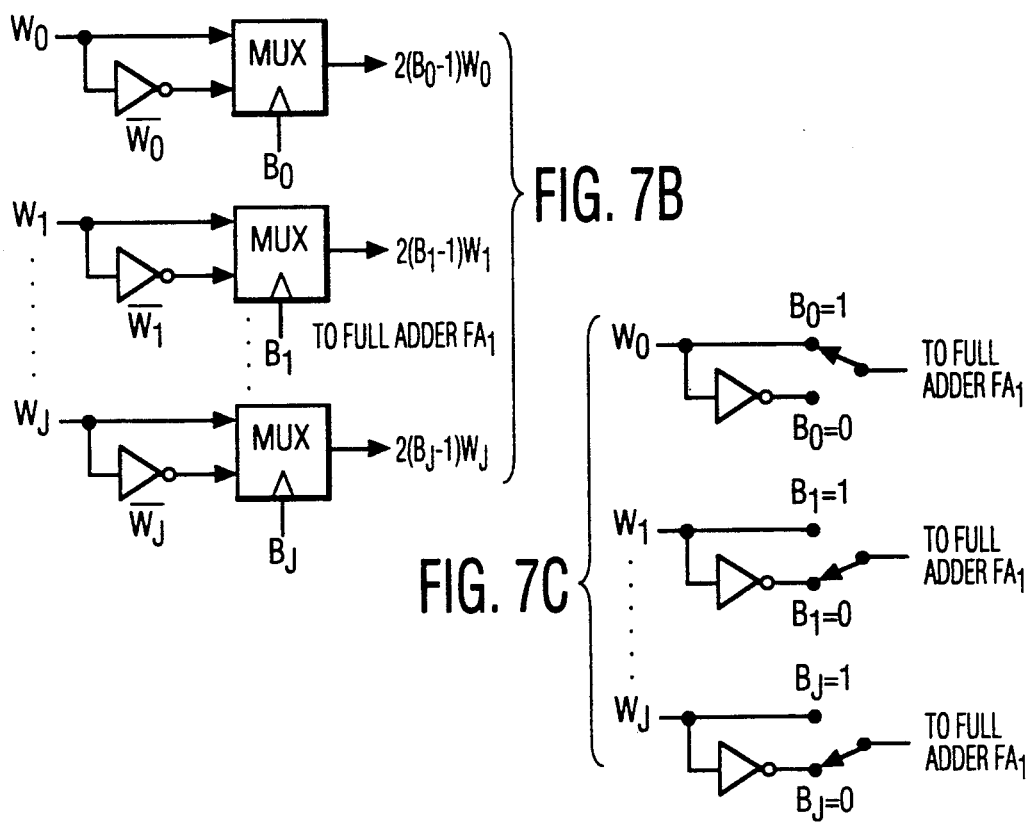
Figure 7C:
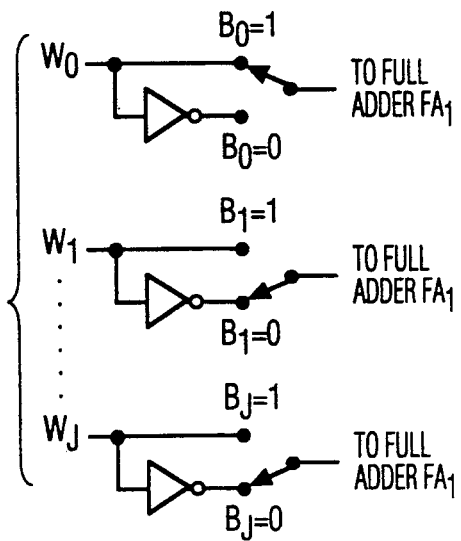

The parities $B_0$ to $B_J$ of FIGS. 2 and 3 have levels of either 0 or 1. The mapping circuit $MC_1$ maps the parities $B_0$ to $B_J$ as shown in FIGS. 7A, 7B, and 7C. Each of the weights $W_i$ is inverted if $B_i$ equals 0 and is not inverted if $B_i = 1$ (i=0 to J). This produces weighted parities $(2B_0-1) W_0$, $(2B_1-1) W_1$, ... $(2B_J-1) W_J$.

The full adder $FA_1$ of FIG. 2 sums the weighted parities $(2B_0-1) W_0$, $(2B_1-1) W_1$, ... $(2B_J-1) W_J$ to obtain a decision variable F. The comparator $CO_1$ compares the value of F with 0 to produce a value $\hat{C}_m$ representing the decode orthogonal bit. If the value $F>0$, then $\hat{C}_m$ is 1, if $F<0$, then $\hat{C}_m$ is 0.

Upon completion of the operation by the comparator $CO_1$, the sampled data is shifted cyclically one bit to the right.

The above circuitry of FIGS. 1 to 4 repeats the aforementioned process to decode a different bit of the code word. The new bit formed is now the orthogonal code bit. The system repeats the process n times to decode the entire code word. After decoding the entire code word, the select switches $SE_1$ and $SE_2$ enter a new code word into the shift register $SR_1$ and $SR_2$. Suitable memories in the demodulator and the output circuit store the samples and orthogonal bits as needed.

The circuit of FIGS. 1 to 4 improves the operation of the communication system and the efficiency of the decoding by virtue of the operation of the weight function circuits $WF_0$ to $WF_J$. The latter determine not only the least reliable component of the weights $W_0$ to $W_J$, i.e. the minimum of the n outputs, but also the number of occurrences of the minimum value.

Figure 5:
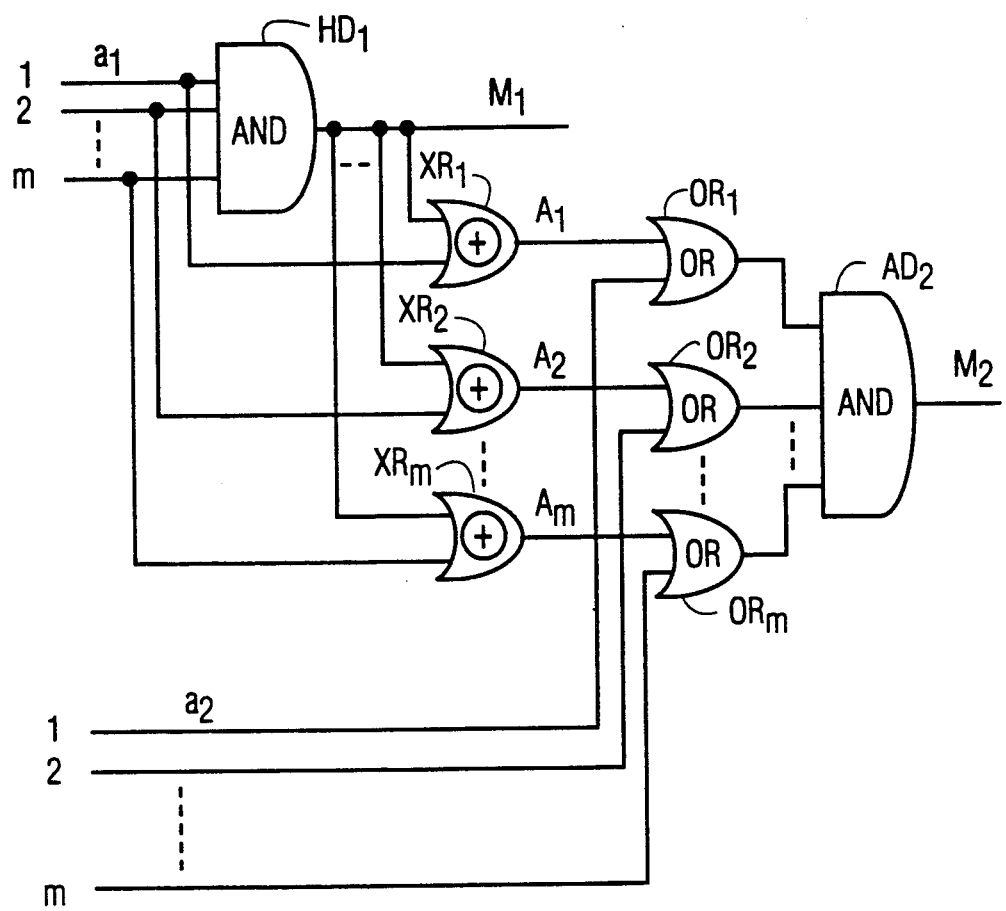
FIGS. 5 and 6 are logic and block diagrams showing details of portions of FIG. 2.
Figure 6:
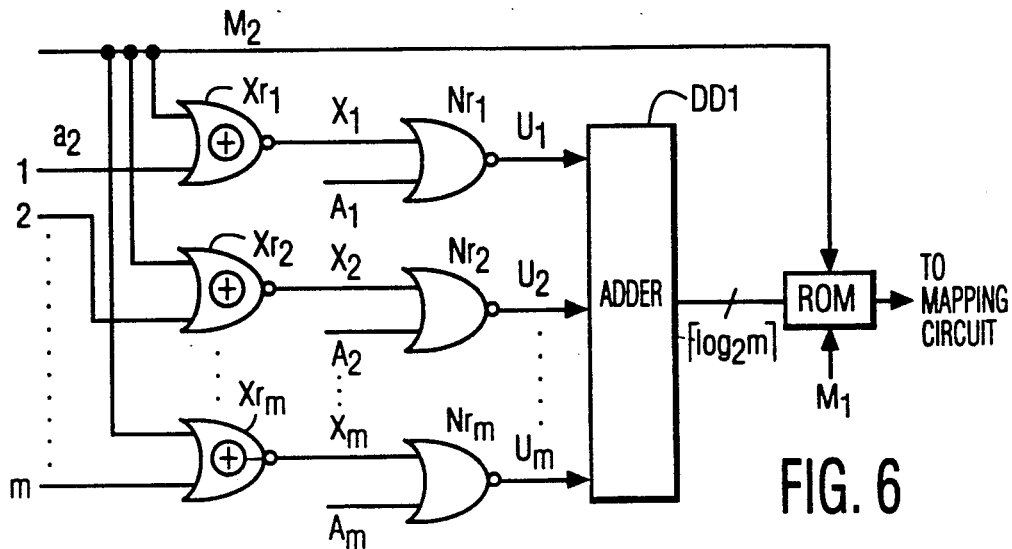

FIGS. 5 and 6 exhibit details of the weight function circuit $WF_J$, which is identical to and representative of the circuits $WF_0$ to $WF_J$. As noted from FIG. 4, each weight function circuit $WF_1$ to $WF_J$ receives $(Q-1)*m$ samples from the reorder circuit $RC_2$. As shown in FIG. 5, Q is assumed to be 3, and the inputs to the weight function circuit $WF_J$ are regrouped from m groups of Q-1 inputs as shown in FIG. 4, to Q-1 groups of m inputs each. The first group of m inputs carries the name $a_1$, and the second group of m inputs bears the designation $a_2$. This arises because if we assume Q=3, each of the n received samples is represented by a 3 bit number $a_{0, 1}$, and $a_2$ one of which, $a_0$, is the hard decision in the sample. Accordingly, the remaining two bits $a_1$ and $a_2$ in the sample represent the reliabilities or soft decision. Thus, the output of the reorder circuit $OC_1$ to the weight function $WF_J$ is in the form of m samples $a_1$ and $a_2$. The magnitude of each of the m samples is $a_1$ $a_2$ for that sample. These are regrouped in the form of m inputs $a_1$, $a_2$.

The values of the m components $a_1$ constitute the input of an AND gate $AD_1$ as well the inputs of respective exclusive OR gates $XR_1$, $XR_2$, ... $XR_m$. The output $M_1$ of the AND gate $AD_1$ is 0 if any one of the four inputs $a_1$ to the AND gate $AD_1$ is 0. If all of the inputs to the AND gate $AD_1$ are 1, $M_1$ equals 1.

The value 0 or 1 of $M_1$ at the output of the AND gate $AD_1$ forms the input of m exclusive OR gates $XR_1$, $XR_2$, ... $XR_m$. When $M_1$ is 1, the output of the exclusive OR gates are all zeros because all the values $a_1$ are also 1. When $M_1$ is zero, then the output of each corresponding exclusive OR gate $XR_1$, $XR_2$, ... $XR_m$ is the value $a_1$ of the corresponding sample.

The outputs $A_1$, $A_2$, ... $A_m$ of the exclusive OR gates $XR_1$, $XR_2$, ... $XR_m$ appear at the inputs of OR gates $OR_1$, $OR_2$, ... $OR_m$. The other inputs to the latter OR gates are the m values $a_2$. Hence, when $M_1$ is 1, the output of the exclusive OR gates $XR_1$ to $XR_m$ are all zeros and hence the outputs of the OR gates $OR_1$, $OR_2$, ... $OR_m$ represent the m values $a_2$.

When $M_1$ is 0, the inputs to the OR gates $OR_1$, $OR_2$, ... $OR_m$ from the exclusive OR gates $XR_1$ to $XR_m$ correspond to the m values of $a_1$. The other inputs to the OR gates $OR_1$, $OR_2$, ... $OR_1$ represent the m values of $a_2$. Then each output of the OR gates $OR_1$ to $OR_m$ is a 1 unless a corresponding pair of $a_1$ and $a_2$ is 0.

The OR gates $OR_1$, $OR_2$, ... $OR_m$ pass the signals applied thereto to an AND gate $AD_2$ having an output $M_2$. If $M_1$ is 1 because all m $a_1$ values are 1 and hence all exclusive OR gates $XR_1$ to $XR_m$ are 0, the AND gate $AD_2$ goes to 1 only if all values $a_2$ are 1 and goes to 0 if any one of the values $a_2$ is 0.

On the other hand if $M_1$ is 0 because at least one value $a_1$ is 0, and hence the outputs of the exclusive OR gates $XR_1$ to $XR_m$ correspond to the m values $a_1$, then the AND gate $AD_2$ produces a 1 unless a corresponding pair of values $a_1$ and $a_2$ is 0.

In effect, if $M_1$ is 1, the circuitry ANDs, the components $a_2$ to obtain $M_2$. If $M_1$ is zero, then the circuit logically ANDs only the values $a_2$ whose components $a_1$ in the sample are 0.

As shown in FIG. 6, the output $M_2$ passes to the inputs of m exclusive OR gates $Xr_1$, $Xr_2$, ... $Xr_m$ which also receive the m respective values $a_2$. These gates indicate at their respective outputs $X_1$, $X_2$, ... $X_m$ whether the value $M_2$ corresponds to the values of $a_2$. A similar determination occurred at the outputs $A_1$ to $A_m$ which denoted whether $M_1$ corresponds to the values $a_1$. The plurality m NOR gates $Nr_1$, $Nr_2$, ... $Nr_m$ receive respective values $A_1$ to $A_m$ and values $X_1$ to $X_m$ to determine whether they differ or not, and hence whether $M_1M_2$ equals $a_1a_2$ or not. An adder $DD_1$ adds the outputs $U_1$ to $U_m$ of gates $Nr_1$ to $Nr_m$ to obtain the number N of times the minimum occurs.

A read only memory (ROM) $RM_1$ receives the output $M_1$ at the output of the AND gate $AD_1$, the value $M_2$ at the AND gate $AD_2$, and the number N from the adder $DD_1$ to produce the weight $W_J$. The ROM $RM_1$ establishes the minimum $|y_{min}|$ which represents the digital value of the values $M_1$ and $M_2$. It then produces an output $W_J$ based on the following look-up table. This look-up table is, for an example, for the (21, 11) threshold decodable block code, J=5, m=4.

TABLE 1

| $M_1$ | $M_2$ | $|y_{min}|$ | N | output W |
|---|---|---|---|---|
| 0 | 0 | 0 | 4 | 1 |
| 0 | 0 | 0 | 3 | 2 |
| 0 | 0 | 0 | 2 | 4 |
| 0 | 0 | 0 | 1 | 8 |
| 0 | 1 | 1 | 4 | 14 |
| 0 | 1 | 1 | 3 | 16 |
| 0 | 1 | 1 | 2 | 19 |
| 0 | 1 | 1 | 1 | 24 |
| 1 | 0 | 2 | 4 | 30 |
| 1 | 0 | 2 | 3 | 32 |
| 1 | 0 | 2 | 2 | 35 |
| 1 | 0 | 2 | 1 | 40 |
| 1 | 1 | 3 | 4 | 50 |

The size of the ROM = 13 $\lceil \log_2 50 \rceil$
= 13 * 6
= 78 bits

FIGS. 7A to 7C illustrate a mapping circuit embodying the invention. FIG. 7B shows details of FIG. 7A, and the latter is a shorthand version of FIG. 7B. Here multiplexers $MUX_i$, where i=0...J, receive the value $W_i$ directly and $\overline{W}_i$ through inverters $IN_i$. The multiplexers $MUX_i$ choose one of inputs W or $\overline{W}$ depending on whether B is 0 or 1. FIG. 7C illustrates a circuit equivalent of the diagrams in FIG. 7A and 7B. Here the switches $B_i$ switch between $W_i$ and $\overline{W}_i$.

According to other embodiments of the invention, n can be other lengths such as 273 or 1057 or any shortened version of such codes.

As stated, the weighted parities $(2B_O-1)W_O$ to $(2B_J-1)W_J$ enter the inputs of a full adder $FA_1$. The latter forms a decision variable F. As shown in FIG. 2, the comparator $CO_1$ compares the value F with 0 to produce a value $\hat{C}_m$ to establish a value 1 or 0. The value 1 or 0 passes to the output circuit $OC_1$ either directly or through a second buffer.

The select switch $SE_1$ then circulates the last bit on the right of the register $SR_1$ to the first position and shifts the content of the register one bit to the right. The select switch $SE_2$ then circulates the last Q−1 bits of the $SR_2$ to the entry positions and shifts the content of the register Q−1 bits to the right. This starts the next cycle. The process now repeats until the formation of a new bit $C_m$.

When all the cycles have been completed, i.e. the bits representing all the samples have been shifted, the storage buffer $SB_1$ replaces the MSB's and LSB's of the samples in the shift registers $SR_1$ and $SR_2$ with the MSB's and LSB's in a new block. The cycles are then repeated for the new block.

Figure 8:
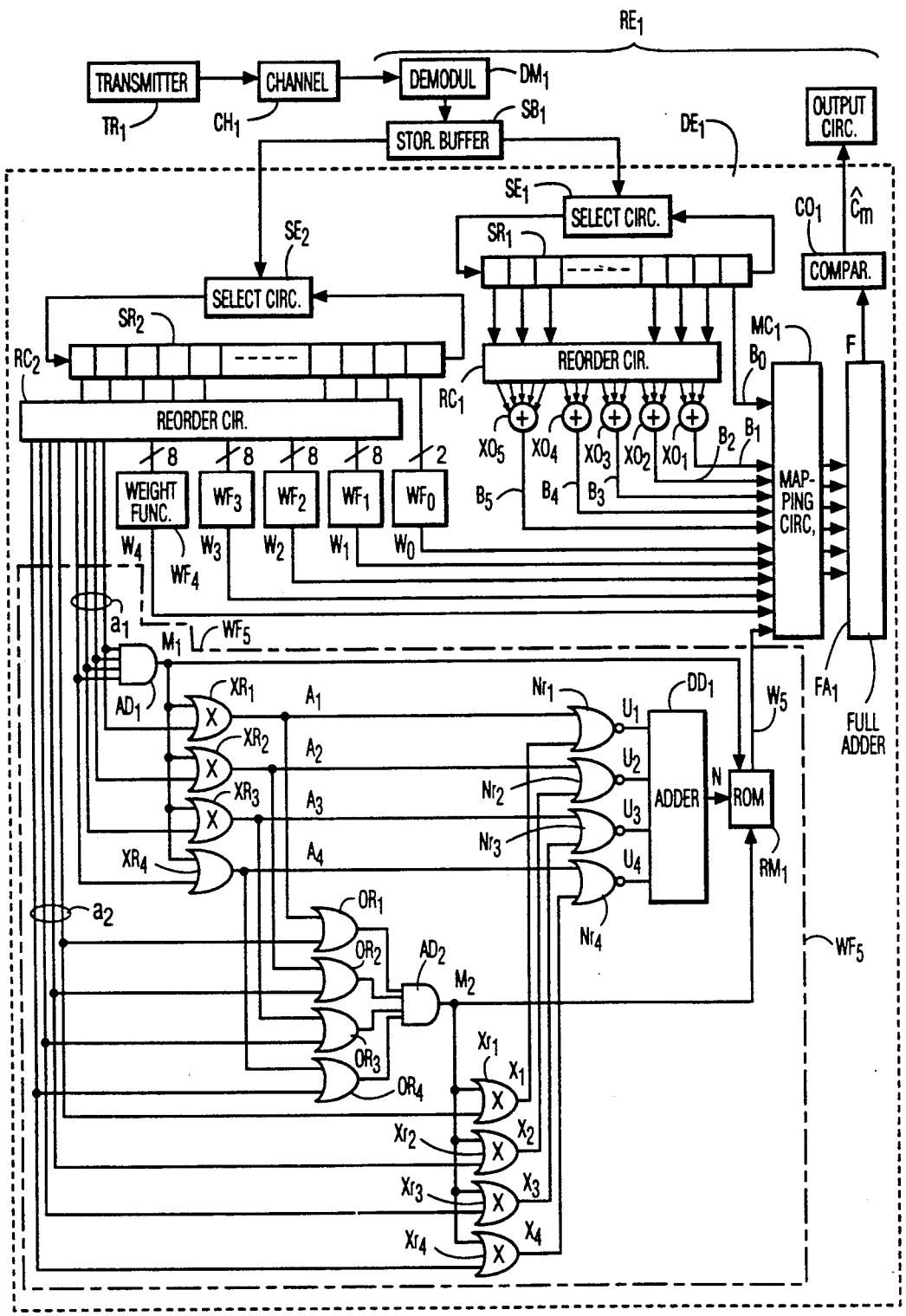
FIG. 8 is a partial block and logic diagram showing a communication system embodying features of the invention and including a weight function circuit according to the invention.

FIG. 8 illustrates a more specific embodiment of the invention wherein Q=3, m=4, and J=5. The circuit elements and operation are otherwise the same as the circuits in FIGS. 1 to 6.

FIG. 9 illustrates the transmitter $TR_1$ of FIGS. 1 and 7. Here, an analog video generator $AV_1$ generates analog video signals which enter an analog to digital (A/D) converter ADC. The latter converts the video signals and passes them to a compressor $CP_1$ which compresses the signals. An encryptor $EN_1$ encrypts the compressed signals and passes the signals to a forward error correction (FEC) encoder $FE_1$. A modulator $MD_1$ then modulates the resulting data stream and sends it to the communication channel.

Figure 11:
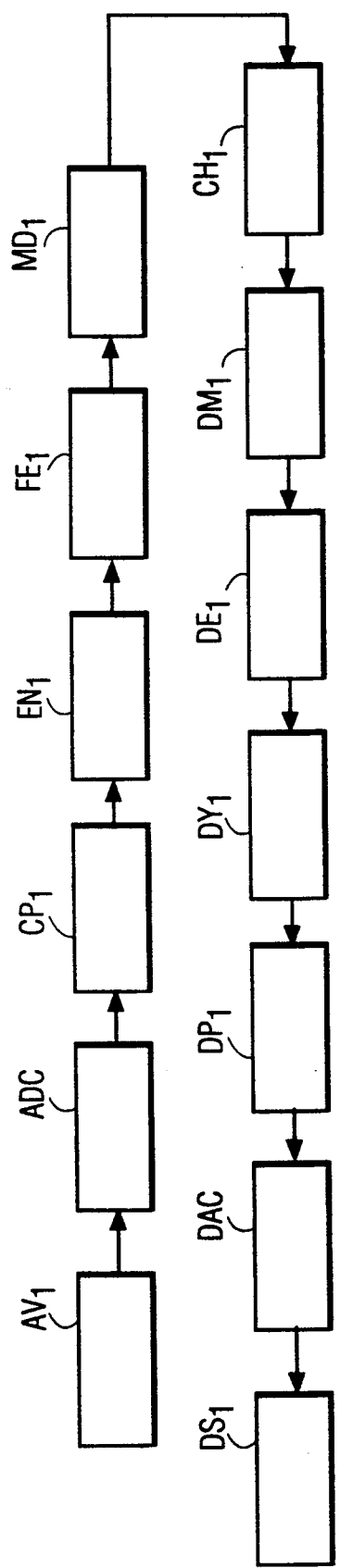
FIG. 11 is a block diagram of a transmission system depicting a combination of circuitry in FIGS. 1, 2, and 3.

FIG. 10 shows the output circuit $OC_1$ which, together with the demodulator $DM_1$ and the decoder $DE_1$, forms the receiver of the communication system in FIGS. 1 to 9. The output circuit $OC_1$ includes a decryptor $DY_1$ that decrypts the error corrected received data, a decompressor $DP_1$ for decompressing the decrypted signals, a digital to analog (D/A) converter DAC for reconverting the signal to the analog state, and a display system $DS_1$ that includes audio and video outputs. The complete system is shown in FIG. 11. Here, like reference characters denote like parts of those in FIGS. 1 to 10, and the like parts perform the same functions.

Figure 12:
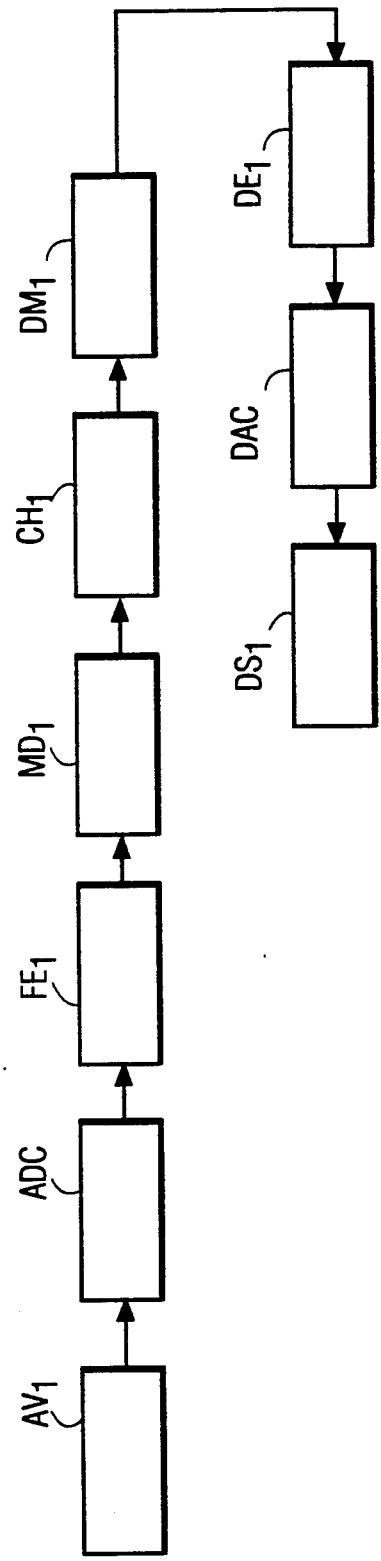
FIG. 12 is a block diagram of another system embodying the features of FIG. 1.

According to an embodiment of the invention, the systems of FIGS. 9 to 11 do not include the encryptor $EN_1$, the compressor $CP_1$, the decrypter $DY_1$, and the decompressor $DP_1$. FIG. 12 discloses this arrangement.

Figure 13:
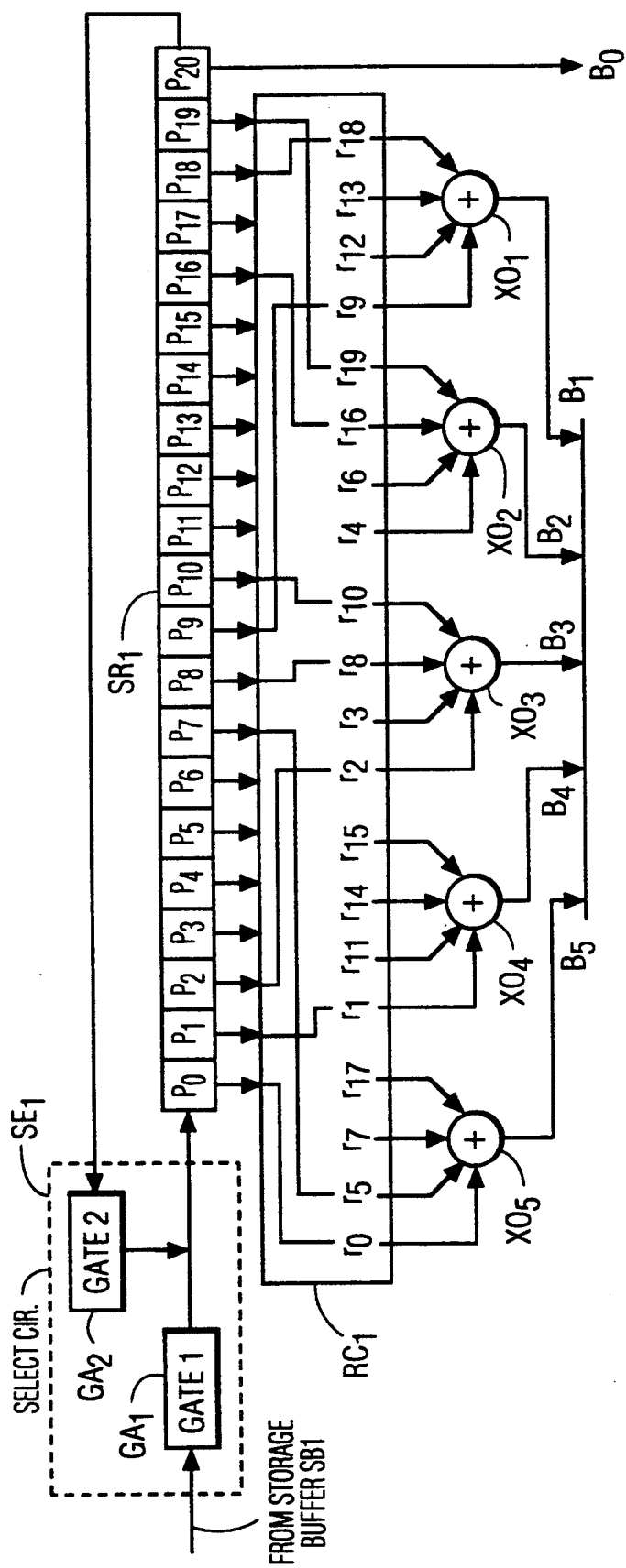
FIG. 13 is a diagram illustrating the arrangement in FIG. 1 that generates the parities in FIG. 1.

FIG. 13 depicts details of an example of a circuit for generating the parities $B_0$ to $B_J$ in FIGS. 2, 3, and 8. Here n=21, a number permitting simple diagramming of the connections. The selector $SE_1$ enters the MSB's of the quantized samples into the shift register $SR_1$ with a gate $GA_1$ while a gate $GA_2$ holds feedback from the stage $S_{20}$. When gate $GA_2$ conducts gate $GA_1$ is non-conductive. As mentioned the shift register $SR_1$ has twenty one stages $S_0$ to $S_{20}$. Terminals $r_0$ to $r_{19}$ of the reorder circuit $RC_1$ have subscripts identifying the corresponding stages $S_0$ to $S_{19}$ to which the reorder circuit connects them. Only some of the connections are portrayed while others are omitted for clarity. The reorder circuit $RC_1$ collects the connections into five groups of four lines each to exclusive OR (XOR) circuits $XO_1$ to $XO_J$ on the basis of a known predetermined code. The circuits $XO_1$ to $XO_J$ XOR the values to produce parities $B_1$ to $B_J$. The stage $S_{20}$ itself forms the parity $B_0$.

The selector $SE_2$, shift register $SR_2$, and the reorder circuit $RC_2$ in FIG. 4 operate in similar manner on the basis of a known code. The final two stages of the shift register $SR_2$ form the input to the weight function circuit $WF_0$.

In operation, the demodulator $DM_1$ receives signal distorted by the channel $CH_1$ from the transmitter $TR_1$ and quantizes samples of the signals into $Q=3$ bits which it applies stores in the storage buffer $SB_1$. The latter applies them to the decoder $DE_1$. The MSB becomes the hard decision on the sample and the $Q-1=LSB$'s represent the magnitude of the sample. Hence, if $Q=3$, there are two possibilities for the hard decision or parity of each sample and the $2^{Q-1}=m=2^2=4$ possibilities for the magnitude or reliability of each quantized sample. The circuits $SE_1$, $SR_1$, $RC_1$, and $XO_1$ to $XO_J$ form the parities $B_0$ to $B_J$ on the basis of the exclusive OR gates $XO_1$ to $XO_J$. On the other hand, the circuits $SE_2$, $SR_2$, $RC_2$, and $WF_1$ to $WF_J$ implement weight functions $W_0$ to $W_J$ for the parities $B_0$ to $B_J$. Only the magnitudes of the m components of the LSB's determine the weight function. The weight function circuits establish the minimum in each sample of the m magnitudes and the number of times N the minimum appears. The result appears at the read only memory $RM_1$ whose output is the weight function represented by K bits. The possible values for the weight function are preset according to the aforementioned table. In this regard, the determinations are based on equations (3) or (4) to follow.

The determination of the minimum value of m positive numbers and the number of occurrences of the minimum value is done in the weight function circuit $WF_J$ as shown in FIGS. 5 and 6. In this case $Q=3$. The quantized received samples are represented by the 3-bit number $a_0 a_1 a_2$ and the hard decision on the sample is $a_0$. Hence $a_1 a_2$ represent the magnitude of the sample. The minimum of the magnitudes of m samples is $M_1 M_2$. The $a_1$'s of the numbers are logically ANDed to obtain the $M_1$ of the minimum value. $M_2$ of the minimum value is established as follows.

If $M_1$ is 1, logically AND the $a_2$'s to obtain $M_0$. On the other hand, if $M_1$ is 0, then logically AND on the $a_2$'s of those components whose $a_1$ are 0. When $M_1$ is 1, then $A_1$ to $A_m$ (the output of the gates $XR_1$ to $XR_m$) are all 0's (since all the $a_1$'s are 1) and hence the output of the OR gate following the $A_1$ to $A_m$ is the corresponding $a_2$. These are logically ANDed to get $M_2$. Hence the corresponding $A_2$ passes through to the final AND gate only if an $a_1$ is an 0. Otherwise, a 1 is passed to the final AND gate $AD_2$. To count the number of elements that are equal to the minimum, it is noted that any $A_1$ to $A_m$ serves as a flag to indicate if $a_1$ is equal to the corresponding $M_1$ or not. That is, if $A_1$ to $A_m$ are all 0, then the i-th $a_1$ is equal to $M_1$. The XOR gates $Xr_1$ to $Xr_m$ create a similar flag $X_1$ to $X_m$ to indicate if $a_2$ is equal to $M_2$ or not. NOR gates $Nr_1$ to $Nr_m$ execute logical NOR operations on $X_1$ to $X_m$ and $A_1$ to $A_m$ to obtain $U_1$ to $U_m$ which indicates if $M_1 M_0$ is equal to $a_1 a_2$ or not. The values $U_1$ to $U_m$ are added to the number of minima N.

Figure 14:
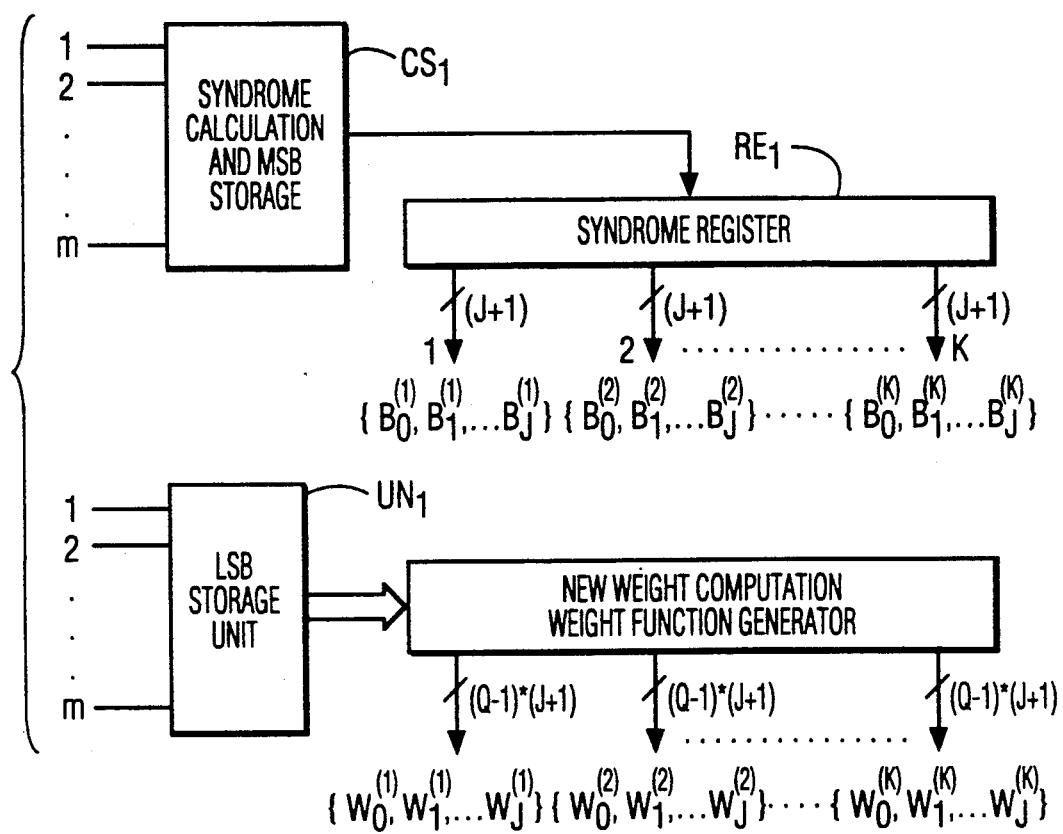
FIGS. 14 and 15 are other embodiments of portions of the circuit in FIG. 2.
Figures 15, 16:
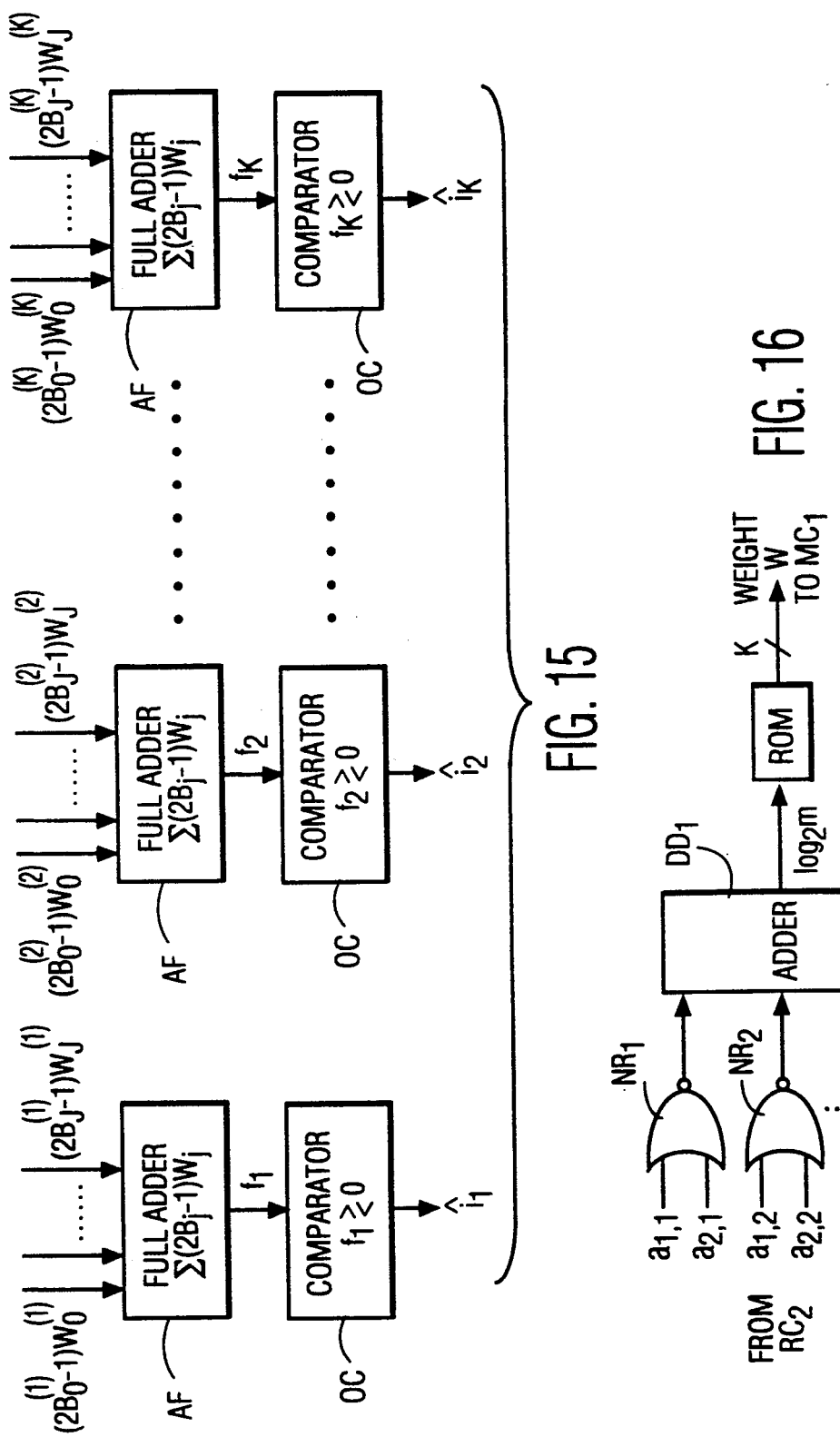
FIG. 16 is yet another embodiment of portions of the circuit in FIG. 2.

Another embodiment of the invention appears in FIGS. 14 and 15 for obtaining weight functions in soft decision decoding of a rate k/n threshold decodable convolutional code.

In FIGS. 14 and 15, the quantizing and storage $CS_1$ performs the functions of demodulator $DE_1$ and buffer $SB_1$, while a register $RE_1$ corresponds to the parity generator $PG_1$. The unit $UN_1$ supplies the generator $GW_1$ corresponding to $WG_1$. In FIG. 15, a set of full adders AF and comparators OC form output bits $i_k$.

The Invention is based upon the following general considerations. It should be noted that the symbols in the following may not conform to those previously used.

Denote a parity (or syndrome), determined from the binary hard decisions of the components of an error correction code by $$B = r_1 \oplus r_2 \oplus \ldots \oplus r_m, \quad (1)$$

where the symbol $\oplus$ represents binary XOR operation. Further, denote by $p_i$ the probability that the hard decision $r_i$ is in error, given that the corresponding quantized (to Q bit representation) analog sample is $y_i$. Since one of the Q bits is used to represent the hard decision $r_i$, the remaining $(Q-1)$ bits are used to represent the absolute value of the sample $y_i$. The possible values $|y_i|$ are denoted $0, 1, \ldots, (2^{Q-1}-1)$, where the notation $|x|$ denotes the absolute value of the real number x. Denote by W the soft decision weight function of B involved in the soft decision decoding of the error correction code.

The previously known simplified weight function uses only the "least reliable" component (in other words, the component with the smallest magnitude) of B. See the aforementioned article by Tanaka et al. Though this method of determining W gives good coding gain for codes with small m, it fails to give good coding gain when m is large.

The invention uses not only the least reliable component of B, but also the number of times it occurs in the parity B in determining the corresponding weight W. This can be written as:

$$W = F(|y_{min}|, N) \quad (2)$$

where $|y_{min}| = \text{minimum of } \{|y_s|; 0 < s < (m+1)\}$

N is the number of elements $y_t$ such that $$|y_t = |y_{min}|, 0 < t < (m+1) \quad (3)$$

The function $F(|y_{min}|, N)$ can be chosen to be one of several functions. Some possible choices are:

$$W = F(|y_{min}|, N) \quad (3a)$$
$$= K \log[(1 + g^N(|y_{min}|))/(1 - g^N(|y_{min}|))];$$

and $$W = F(|y_{min}|, N) \quad (3b)$$
$$= K g^N(|y_{min}|)$$

where the function $$g(|y_{min}|)$$

is given by $$(1 - 2p(|y_{min}|))$$

and K is a positive constant.

The expression $p(|y_{min}|)$ represents the probability of an error given that the $(Q-1)$ bit representation of the magnitude of the received sample is $|y_{min}|$. This appears in the book Threshold Decoding, by J. L. Massey, published by MIT Press, Cambridge, Massachusetts, 1963.

$$p(|y_{min}|) = \frac{\phi\left(\frac{(|y_{min}|+1)\Delta + \sqrt{E_s}}{\sqrt{N_0/2}}\right) - \phi\left(\frac{|y_{min}|\Delta + \sqrt{E_s}}{\sqrt{N_0/2}}\right)}{\phi\left(\frac{(|y_{min}|+1)\Delta - \sqrt{E_s}}{\sqrt{N_0/2}}\right) - \phi\left(\frac{|y_{min}|\Delta - \sqrt{E_s}}{\sqrt{N_0/2}}\right) + \phi\left(\frac{(|y_{min}|+1)\Delta + \sqrt{E_s}}{\sqrt{N_0/2}}\right) - \phi\left(\frac{|y_{min}|\Delta + \sqrt{E_s}}{\sqrt{N_0/2}}\right)} \quad (4)$$

when $0 < |y_{min}| < 2^{(Q-1)} - 2$, and $$p(|y_{min}|) = \frac{1 - \phi\left(\frac{|y_{min}|\Delta + \sqrt{E_s}}{\sqrt{N_0/2}}\right)}{1 - \phi\left(\frac{|y_{min}|\Delta - \sqrt{E_s}}{\sqrt{N_0/2}}\right) + 1 - \phi\left(\frac{|y_{min}|\Delta + \sqrt{E_s}}{\sqrt{N_0/2}}\right)} \quad (5)$$

when $|y_{min}| = 2^{(Q-1)} - 1$.

The function $\phi(x)$ is given by $$\phi(x) = \int_{-\infty}^{x} \frac{1}{2\pi} \exp\left(-\frac{t^2}{2}\right) dt. \quad (6)$$

In (4), $E_s$ is the channel symbol energy in BPSK transmission, $N_0$ is the power spectral density of the additive white Gaussian noise, and $\Delta$ is the step size of the uniform quantizer and is chosen without loss of generality to be $$\Delta = \frac{R}{2^{Q-1} - 1} \quad (7)$$

where R is the chosen range of the absolute value of the received samples.

The general considerations behind the read-only-memory (ROM) are as follows. Assuming that the demodulator output is quantized to 3 bits for the purpose of soft decision decoding, the reliability of any sample is represented by either 0, 1, 2, or 3. Further assuming that the parameter $\Delta$, as defined in equation (7), is equal to $0.3(E_s)^{(\frac{1}{2})}$ then equation (4) gives $$p(0) = \frac{\phi\left(1.3\sqrt{\frac{2E_s}{N_0}}\right) - \phi\left(\sqrt{\frac{2E_s}{N_0}}\right)}{\phi\left(1.3\sqrt{\frac{2E_s}{N_0}}\right) + \phi\left(-0.7\sqrt{\frac{2E_s}{N_0}}\right) - 1}$$

$$p(1) = \frac{\phi\left(1.6\sqrt{\frac{2E_s}{N_0}}\right) - \phi\left(1.3\sqrt{\frac{2E_s}{N_0}}\right)}{\phi\left(1.6\sqrt{\frac{2E_s}{N_0}}\right) - \phi\left(1.3\sqrt{\frac{2E_s}{N_0}}\right) + \phi\left(-0.4\sqrt{\frac{2E_s}{N_0}}\right) - \phi\left(-0.7\sqrt{\frac{2E_s}{N_0}}\right)}$$

$$p(2) = \frac{\phi\left(1.9\sqrt{\frac{2E_s}{N_0}}\right) - \phi\left(1.6\sqrt{\frac{2E_s}{N_0}}\right)}{\phi\left(1.9\sqrt{\frac{2E_s}{N_0}}\right) - \phi\left(1.6\sqrt{\frac{2E_s}{N_0}}\right) + \phi\left(-0.1\sqrt{\frac{2E_s}{N_0}}\right) - \phi\left(-0.4\sqrt{\frac{2E_s}{N_0}}\right)}$$

and $$p(3) = \frac{1 - \phi\left(1.9\sqrt{\frac{2E_s}{N_0}}\right)}{2 - \phi\left(1.9\sqrt{\frac{2E_s}{N_0}}\right) - \phi\left(-0.1\sqrt{\frac{2E_s}{N_0}}\right)}$$

Assuming that $10 \log_{10}(E_s/N_0) = 3$ dB, then $p(0) = 0.2398$, $p(1) = 0.0296$, $p(2) = 0.003$, and $p(3) = 0.00013$. Now the weight W is determined by using Equation (3a). For the values of the minimum reliabilities and the values N in Table 1, the first computed values are, from top to bottom in Table 1, 0.0638, 0.1232, 0.2412, 0.5011, 0.9156, 1.0396, 1.215, 1.516, 1.9195, 2.0445, 2.2205, 2.5216, 3.2195. The value of K is then chosen to normalize the values that W can take. In Table 1, the value K is chosen equal to the inverse of the minimum value 0.0638, which allows the other values to come close to some positive integers to facilitate the easy implementation of the ROM. Since the largest value of the normalized weight is 50, only 6 bits are needed to represent normalized W. Hence the size of the ROM is 13*6=78 memory locations.

According to another embodiment, a further simplification occurs when the blocklength of a block code is large, or when the constraint length of the convolutional code is large and when the signal-to-noise ratio is low to moderate. A weight function circuit embodying this principle appears in FIG. 16. In such a case, instead of determining the $|y_{min}|$ from m elements each having a $(Q-1)$ bit representation, it is assumed that $|y_{min}|$ is 0 and only the number of components in the parity equation (1) with magnitude 0 are counted. This simplifies the decoder a great deal. Thus when quantizing the samples to be used in soft decision decoder, it is sufficient to store the hard decision and if the magnitude of the sample is 0 or not.

The circuit of FIG. 16 replaces those of FIGS. 5 and 6 and receives the same inputs. Here, however the m* $(Q-1)$ inputs are not regrouped from the m groups of $Q-1$ inputs to the weight function circuits of FIG. 4. Rather the inputs remain grouped in as m groups of $(Q-1)$ inputs $a_1 a_2$. NOR gates $NR_1, NR_2 \ldots NR_m$ each receive inputs $a_1$ and $a_2$ and apply them to adder $DD_1$. The latter is the same as that of FIG. 6. The ROM $RM_1$ operates on the same basis with 0 inputs for $M_1$ and $M_2$.

The extra coding gain that can be obtained by using this weight function is substantial when the block code has large block length, or, when the convolutional code has large constraint length (and/or high rate). It is easy to implement and does not have the complexity of the exact weight function.

In other embodiments of the invention, the soft decision decoder output is either fed back to itself, i.e. the decoder input, or fed forward to a separate decoder. The output of the soft decision decoder can be either hard decisions or soft decisions.

Figure 17:
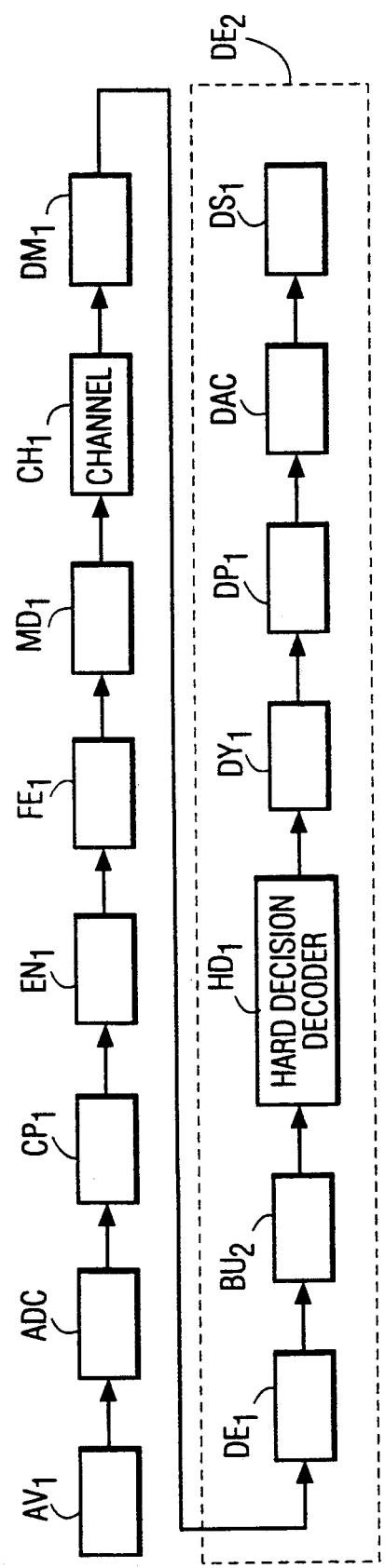
FIGS. 17, 18, 19, and 20 illustrate still other embodiments of the invention.

FIG. 17 shows hard decision output of the soft decision decoder being fed forward to a hard decision decoder. In FIG. 17, the decoder $DE_2$ replaces the soft decision decoder $DE_1$ in the circuits of FIGS. 1, 8, 11, and 12. The decoder $DE_2$ includes the decoder $DE_1$, a buffer $BU_2$ to store the output of the decoder $DE_1$, and a hard decision decoder $HD_1$. The hard decision decoder $HD_1$ takes the output of the soft decision decoder $DE_1$ stored in the buffer $BU_2$ and subjects it to hard decision decoding to form the output of the decoder $DE_2$.

Figure 18:
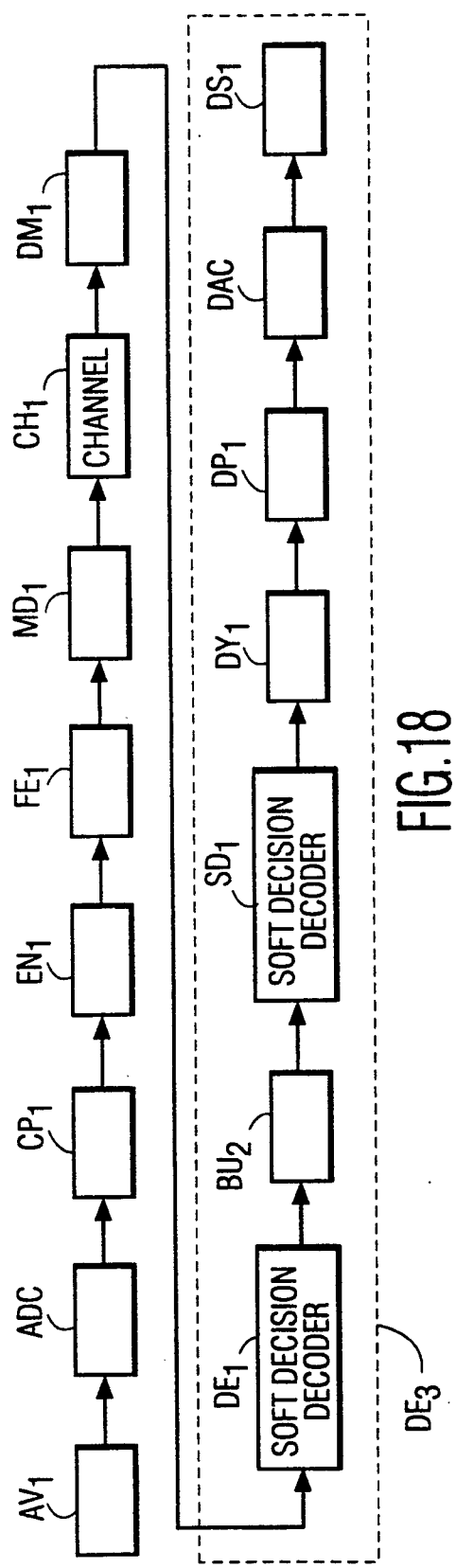

FIG. 18 corresponds to FIG. 17 but substitutes a decoder $DE_3$ in which the hard decision decoder $HD_1$ is replaced with a soft decision decoder $SD_1$, for example a decoder corresponding to $DE_1$.

Figure 19:
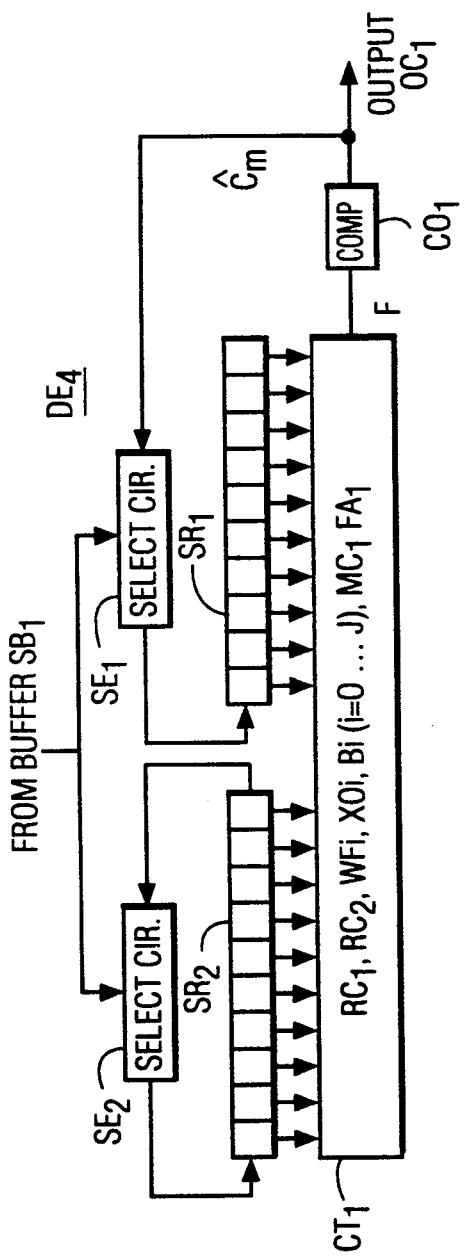

FIG. 19 shows a decoder $DE_4$ which is another form of the decoder $DE_2$ in FIG. 17. The decoder $DE_4$ is identical to the decoder $DE_1$ except for omission of the connection between the last stage of shift register $SR_1$ to the select circuit $SE_1$ of FIGS. 3 and 8. Instead the output of the soft decision decoder $DE_1$ is fed back to the input of the same soft decision decoder at the shift register $SR_1$ for the hard decisions. Here the decoded output $\hat{C}_m$ from the comparator $CO_1$ of FIGS. 2 and 8 passes not only to the output circuit $OC_1$, but also feeds back to the select circuit $SE_1$ at the input of the hard decision shift register $SR_1$ of FIGS. 3 and 8. This feedback replaces the feedback in FIGS. 3 and 8 from the last stage of the shift register $SR_1$ to the select circuit $SE_1$. This arrangement improves the resulting decoding. The circuit $CT_1$ includes the elements $RC_1, RC_2, WF_i, XO_i, B_i (i=0 \ldots J), MC_1, FA_1,$ etc. in FIGS. 2 to 4 and 8.

Figure 20:
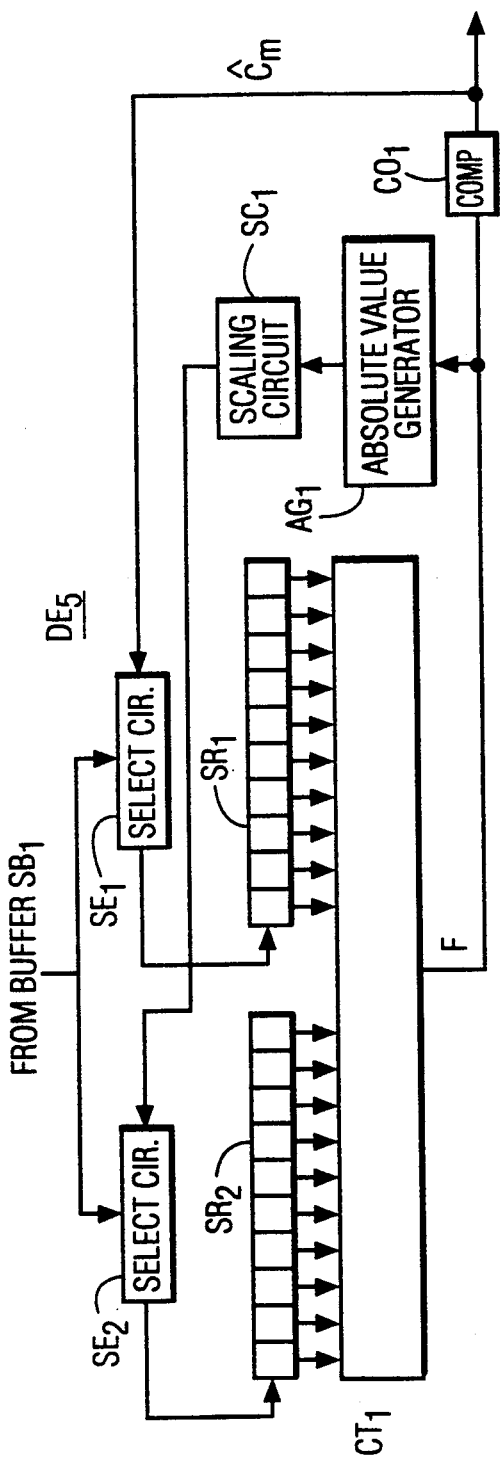

FIG. 20 shows a decoder $DE_5$ which is another form of the decoder $DE_3$ in FIG. 18. The decoder $DE_5$ is identical to the decoder $DE_4$ except for the omission of the connection from the last stage of the register $SR_2$ to the select circuit $SE_2$. Instead in FIG. 20, an absolute value generator $AG_1$ produces the absolute value of the output F from the full adder $FA_1$ in FIGS. 2 and 8. A scaling circuit $SC_1$ divides the absolute value by $J+1$ and feeds the divided value to the select circuit $SE_2$ at the input to the soft decision shift register $SR_2$ in FIGS. 4 and 8. This feedback replaces the feedback in FIGS. 4 and 8 from the last stage of the shift register $SR_2$ to the select circuit $SE_2$. This arrangement further improves the resulting decoding.

While embodiments of the invention have been described in detail, it will be evident to those skilled in the art that the invention may be embodied otherwise.

What is claimed is:

1. An apparatus for processing a stream of data, comprising:

first generating means for generating a set of hard decisions and a set of soft decisions from the stream of data;

means for forming a plurality of first subsets from the set of hard decisions parity generating means for generating a set of parities from a plurality of first subsets of said set of hard decisions;

means for forming a plurality of second subsets from the set of soft decisions;

weight function generating means for generating a plurality of weight functions from said plurality of second subsets of the set of soft decisions based on how many times a given one of said soft decisions occurs in each second subset, and correcting means for producing a corrected data stream with said weight functions and said parities.

2. An apparatus as in claim 1, wherein:

said first generating means includes means for quantizing said stream of data into multiplicities of bits each multiplicity having a most significant bit and bits of lesser significance;

said first generating means includes means for generating each of said hard decision from the most significant bit; and said first generating means includes means for generating said soft decisions form the lesser significant bits.

3. An apparatus as in claim 1, wherein:

said parity generating means includes means for logically combining the hard decisions of said first subsets; and said correcting means includes means for producing a corrected data stream includes means for weighting the parities with the weight functions, means for adding the weighted parities, means for comparing the added weighted parities to a threshold for producing said corrected set of bits.

4. An apparatus as in claim 3, wherein:

said first generating means includes means for forming the set of hard decisions and the set of soft decisions, and means for cyclically shifting the set of hard decisions and the set of soft decisions to create new sets of hard decisions and soft decisions.

5. An apparatus as in claim 3, wherein:

said first generating means includes means for generating a hard decision and a soft decision from the same data element in a stream of data producing a set of soft decisions that correspond to the set of hard decisions;

said parity generating means and said weight function generating means form a corresponding plurality of first functions form the subsets of hard decisions and a plurality of second function from the subsets of soft decisions.

6. An apparatus as in claim 1, wherein:
said soft decisions represent reliabilities and are defined by two bits with values 00, 01, 10 and 11, wherein a reliability increases as the value of the bits increases.

7. An apparatus as in claim 6, wherein:
said soft decision is 00 in each of said second subsets.

8. An apparatus as in claim 1, wherein:
said soft decisions in each second subset include a given minimum value soft decision, ad the given soft decision is the minimum value soft decision in each second subset.

9. An apparatus as in claim 8, wherein each soft decision has two bits, one of said bits being a more significant bit and the other bit being a lesser significant bit said weight function generating means for establishing a given minimum value soft decision from each second subset and how often the given minimum value soft decision occurs in each second subset includes:
  means for logically ANDing a set of more significant bits of two bits representing the soft decisions of a second subset to obtain a first result;
  logic means responding to the first result being 1 for logically ANDing the lesser significant of the two bits representing the set of soft decisions of the second subset to obtain a second result;
  said logic means responding to the first result being zero for logically ANDing the lesser significant of the two bits representing the soft decisions of the second subset whose more significant bit is a 0;
  means for determining whether each of the more significant of the two bits representing the soft decisions of the second subset is equal to the first result and for determining whether each of the lesser significant of the two bits representing the soft decisions of the second subset is equal to the second result; and
  means for logically NORing the determining of said determining means to obtain a plurality of indicators; and
  means connected to the means for logically NORing for adding the indicators.

10. An apparatus as in claim 1, wherein:
a predetermined look-up table receives said soft decisions and how many times the given one of the soft decisions occurs in each of said second subsets to obtain a weight function.

11. An apparatus as in claim 1, further comprising:
decoding means coupled to said correcting means for further decoding said corrected data stream to produce a further corrected data stream.

12. An apparatus as in claim 1, further comprising:
feedback means for feeding the corrected data stream of said correcting means to said parity generating means for further decoding the corrected data stream.

13. The method of processing a stream of data, comprising:

generating a set of hard decisions and a set of soft decisions form the stream of data forming a plurality of first subsets from said set of hard decisions;

generating a set of parities from each of first subsets of said set of hard decisions;

forming a plurality of second subsets from said set of soft decisions;

generating a plurality of weight functions from said plurality of second subsets of the set of soft decisions, said generating of each weight function includes determining how many times a given one of the soft decisions occurs in each second subset; and producing a corrected data stream with said weight functions and said parities.

14. The method as in claim 13, wherein:
said steps of generating said sets of hard decisions includes quantizing said stream of data into a plurality of bits each plurality having a most significant bit and bits of lesser significance; and each of said hard decisions is generated from the most significant bit; and said soft decisions are generated from the bits of lesser significance.

15. The method as in claim 13, wherein:
said step of generating a set of parities includes logically combining the hard decisions of said first subsets; and said step of producing a corrected data stream includes weighting the parities with the weight functions, adding the weighted parities, comparing the added weighted parities to a threshold to obtain results, the results of said comparisons being the said corrected set of bits.

16. The method as in claim 15, wherein:
said step of generating a set of hard decisions and a set of soft decisions includes the substeps of:

forming a set of the hard decisions and a set of the soft decisions, cyclically shifting the set of hard decisions and cyclically shifting the set of soft decisions to form new sets of hard decisions and set of soft decisions.

17. The method as in claim 15, further comprising:
further decoding said corrected data stream to produce further corrected data streams.

18. The method as in claim 15, wherein:
said generating step for generating a set of hard decisions and a set of soft decisions includes generating a hard decision and a corresponding soft decision form the same data element in a stream of data and producing a set of soft decisions that correspond to the set of hard decisions;

said parity generating step and said weight function generating step form a corresponding plurality of first functions form the subsets of hard decisions and a plurality of second functions from the subsets of soft decisions.

19. The method as in claim 13, wherein:
the soft decisions have values represented by 2 bits having magnitudes, namely 00, 01, 10, and 11, wherein a value increases as the magnitude of the bits increases.

20. The method as in claim 19, wherein:
said soft decisions having minimum values, said step of generating weight functions includes establishing minimum soft decisions having minimum values;

said given soft decision is the minimum soft decision in each second subset.

21. The method as in claim 20, wherein each soft decision measure has two bits, one of said bits being a more significant bit and the other bit being a lesser significant bit the step of a minimum soft decision from each second subset and the number of times the minimum soft decision occurs in each second subset includes:
  logically ANDing the set of more significant of the two bits representing the reliabilities of the members of a second subset to obtain a first result;
  if the first result is 1, logically ANDing the lesser significant of the two bits representing the soft decisions of a second subset to obtain a second result;
  if the first result is zero, logically ANDing the lesser significant of the two bits representing the soft decisions of the second subset whose more significant bit is a 0;
  determining whether each of the more significant of the two bits representing the soft decisions of the second subset is equal to the first result;
  determining whether each of the lesser significant of the two bits representing the soft decisions of the second subset is equal to the second result; and
  logically NORing the determining of said determining steps to obtain a plurality of indicators, and adding the logically NORed indicators.

22. The method as in claim 20, wherein:
said minimum soft decision and how many times the minimum soft decisions occurs in each said second subset is in put to a pre-determined look-up table to obtain a weight function.

23. The method as in claim 13, wherein: said given soft decisions is set at 00 in each of said second subsets.

24. A data transfer system, comprising:
a source of a stream of data;
receiver for receiving the stream of data, including a demodulator, an error corrector, and an output;
said demodulator including generating means for generating a set of hard decisions and a set of soft decisions from the stream of data;
said error correcting means including means for forming a plurality of first subsets from the set of hard decisions;
said error corrector including parity generating means for generating a set of parities from a plurality of first subsets of said set of hard decisions;
said error corrector including means for forming a plurality of second subsets form the set of soft decisions;
said error corrector including weight function generating means for generating a plurality of weight functions from said plurality of second subsets of the set of soft decisions based on how many times a given one of said soft decisions occurs in each second subset, and
said output including correcting means for producing a corrected data stream with said weight functions and said parities.

25. A system as in claim 24, further comprising:
decoding means coupled to said correcting means for further decoding said corrected data stream to produce a further corrected data stream.

26. A system as in claim 24, further comprising:
feedback means for feeding the corrected data stream of said correcting means to said parity generating means for further decoding the corrected data stream of said correcting means.

* * * * *